United States Patent [19]
Connell et al.

[11] Patent Number: 5,481,229
[45] Date of Patent: Jan. 2, 1996

[54] LOW POWER TEMPERATURE COMPENSATED CRYSTAL OSCILLATOR

[75] Inventors: Lawrence E. Connell, Naperville; Timothy J. Collins, Downers Grove; Anthony F. Keller, Chicago; Dennis F. Marvin, Carol Stream; Michael L. Bushman, Hanover Park, all of Ill.

[73] Assignee: Motorola, Inc., Schaumburg, Ill.

[21] Appl. No.: 346,452

[22] Filed: Nov. 29, 1994

[51] Int. Cl.$^6$ ............................................. H03L 1/02
[52] U.S. Cl. .................... 331/158; 331/176; 331/177 V; 331/186
[58] Field of Search .......................... 331/116 R, 116 FE, 331/158, 176, 185, 186, 177 V

[56] References Cited

U.S. PATENT DOCUMENTS 4,560,959  12/1985  Rokos et al. .................... 331/176

Primary Examiner—Siegfried H. Grimm
Attorney, Agent, or Firm—Gary J. Cunningham

[57] ABSTRACT

A temperature compensated crystal oscillator (10), has a crystal oscillator circuit (12), a voltage controlled reactance element (30), a temperature compensation network (50), and a programmable DC-DC converter network (60) having an output (62) connected to the voltage controlled reactance element (30), or the temperature compensation network (50) or both. The DC-DC converter network (60) provides the capability of operating over an extended voltage range, by increasing the supply voltage to a level necessary to operate the voltage controlled reactance element (30). Much of this structure is adapted for use in an integrated circuit, and provides the advantages of minimizing power and current consumption.

18 Claims, 3 Drawing Sheets

LOW POWER TEMPERATURE COMPENSATED CRYSTAL OSCILLATOR

FIELD OF THE INVENTION

The invention relates generally to the field of temperature compensating circuits for crystal oscillators, and particularly, to a low power temperature compensated crystal oscillator.

BACKGROUND OF THE INVENTION

Oscillators that have a frequency determining crystal are commonly used to provide a stable output frequency. However, the crystals used in these oscillators are temperature sensitive and therefore temperature compensating means are normally required to maintain a stable oscillator output frequency.

One method of stabilizing crystal oscillator frequency, which has been used, is to enclose the oscillator within an oven and maintain the crystal at a constant temperature. This requires a large amount of space and consumes a substantial amount of power. Another method involves generating a temperature varying voltage and applying it across a voltage variable capacitor (e.g., varactor diode) to control the resonant frequency of the crystal oscillator.

In many oscillators, an AT cut crystal is commonly used and has a generally cubic frequency versus temperature characteristic with an inflection point at approximately 28 degrees C. The precise frequency versus temperature characteristics of individual AT cut crystals is variable, and depends on how the crystal was made. Thus, in order to accurately compensate an oscillator using an AT cut crystal, the voltage applied to the varactor diode should have a temperature variation which is substantially similar to that of the particular crystal being used.

Modern communication systems, including particularly cellular telephones and two-way radios, require products that are smaller, lighter and need to have extended operating times (or battery lives). A significant portion of the size and weight of a portable radio product is attributable to its power source or battery. In order to reduce the size and weight of the battery, circuitry is needed to operate at lower voltages, such as from about 2.7 to about 3.3 volts, with the total current drain being minimized.

Miniature temperature compensated crystal oscillators (TCXOs) commonly use frequency-temperature compensation schemes that generate a voltage that varies with temperature, to drive a voltage variable reactance device, in order to obtain the desired frequency-temperature characteristic. It is necessary to operate the TCXO at various voltages, while maintaining the required temperature compensation characteristics.

Traditionally, the regulated supply voltage for compensation, is obtained by utilizing a simple circuit operating directly from the supply voltage. Thus, if the supply voltage were between 4.5 and 5 volts, a regulator of approximately 4 volts would be utilized. When using reduced voltages, such as 3 volt batteries, it would be very difficult or nearly impossible to compensate the TCXO appropriately, as the circuit needs to have the capability to adjust for a range of frequency-temperature characteristics, and the adjust range is dependent on the supply voltage available to the compensation (i.e., 0–4v).

Thus, it would be considered an improvement in the art to have the capability of using a low voltage power supply, such as a 3 volt battery, which is capable of powering the temperature compensation of a TCXO. It is also considered an improvement, to minimize current drain for substantially the entire compensation circuit, by having the majority of the associated circuitry operate at a reduced supply voltage.

Additionally, not all communication systems can be converted to lower supply voltages, so TCXO designs should have the capability of operating at higher supply voltages, without requiring additional current. Economies of scale, particularly, where custom integrated circuits are developed, require that a single design can be used to operate over extended voltage ranges, or can be operated with 3v or 5v batteries.

It is also considered an improvement in the art, if certain components, such as a programmable DC to DC converter network could be utilized in a TCXO, to provide the capability of operating over an extended voltage range, by increasing the supply voltage to a level necessary to operate a variable reactance device with a minimum increase in current, by supplying that voltage (higher voltage), only to the necessary circuitry, for example, such as to a level shifting network and the variable reactance device, to control the TCXO.

It would also be considered an improvement in the art, to provide a TCXO which draws low power and current, which is adjustable to fit most crystal oscillators, and which is readily manufacturable in an integrated circuit (IC) form.

DETAILED DESCRIPTION OF THE PREFERRED EMBODIMENT

Figure 1:
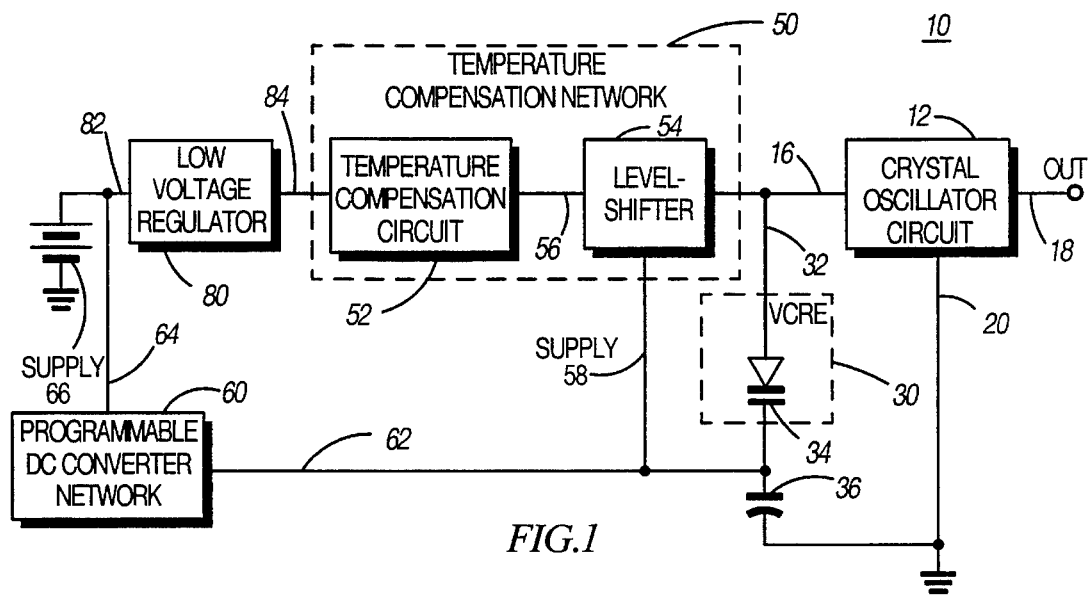
FIG. 1 illustrates a block diagram of a low power temperature compensated crystal oscillator, in accordance with the present invention.

In FIG. 1, a low power temperature compensated crystal oscillator (TCXO) 10, is shown. In its simplest form, the TCXO 10 includes the following structure. First, it includes a crystal oscillator circuit 12 having a crystal, an input line 16 and an output line 18 at a predetermined frequency. Next, a voltage controlled reactance element (VCRE) 30, is shown in FIG. 1 as item 30, for providing a variable reactance signal to the input line 16 of the crystal oscillator circuit 12 for selectively adjusting the output frequency at line 18 over a predetermined temperature range, such as that shown in FIG. 5. The VCRE 30 has a first terminal and a second terminal 32 and 34. In a preferred embodiment, the VCRE 30 is a varactor and the first terminal 32 is an anode and the second terminal 34 is a cathode. Third, a temperature compensation network (TCN) 50 is utilized for measuring the temperature in proximity to the crystal, and providing a control signal to the voltage controlled reactance element 30, to suitably adjust the output frequency (at line 18) within a desired range over a predetermined temperature range. And, a programmable DC-DC converter network (PDCCN) 60 is shown in FIG. 1, which includes an output line 62 comprising a reference voltage, connected to at least one of the voltage controlled reactance element 30 and the temperature compensation network 50.

The instant invention minimizes power and current drain, thereby prolonging battery life in many communication applications (such as cellular telephones, radios and the like), and is readily manufacturable in integrated circuit (IC) form.

More particularly, the PDCCN 60 and level shifter 54 in the TCXO 10, provide a suitable voltage range (i.e., from about 0 to 4 volts) to control the VCRE 30, to provide: (i) appropriate temperature compensation of the crystal in the crystal oscillator circuit 12; (ii) suitable (high) voltage to certain circuits, such as the level shifter 54 (which is used to temperature compensate the crystal, via VCRE 30), to minimize current drain for the TCXO 10 by allowing the majority of the circuits to operate at reduced supply voltages; and (iii) use of smaller power supplies, such as 3 volt batteries, for minimizing size and improving further miniaturization for new communication systems, such as cellular telephones and two-way radios.

The TCN 50 can include a temperature compensation circuit 52 and level shifter 54 connected in series by line 56. A line 58 provides a supply voltage to the level shifter 54. The level shifter 54 provides an amplified control signal to line 16 to the first terminal 32 in FIG. 1, and the second terminal 34 in FIG. 3.

The level shifter 54 translates the low voltage compensation signal at line 56 to a higher voltage level, as required by the VCRE 30. This allows temperature compensation circuit 52 to operate at a lower, more power efficient voltage, such as at about 2.5 volts, while the output of the level shifter 54 can vary from about 0 to 4 volts, for appropriate temperature compensation.

Figure 5:
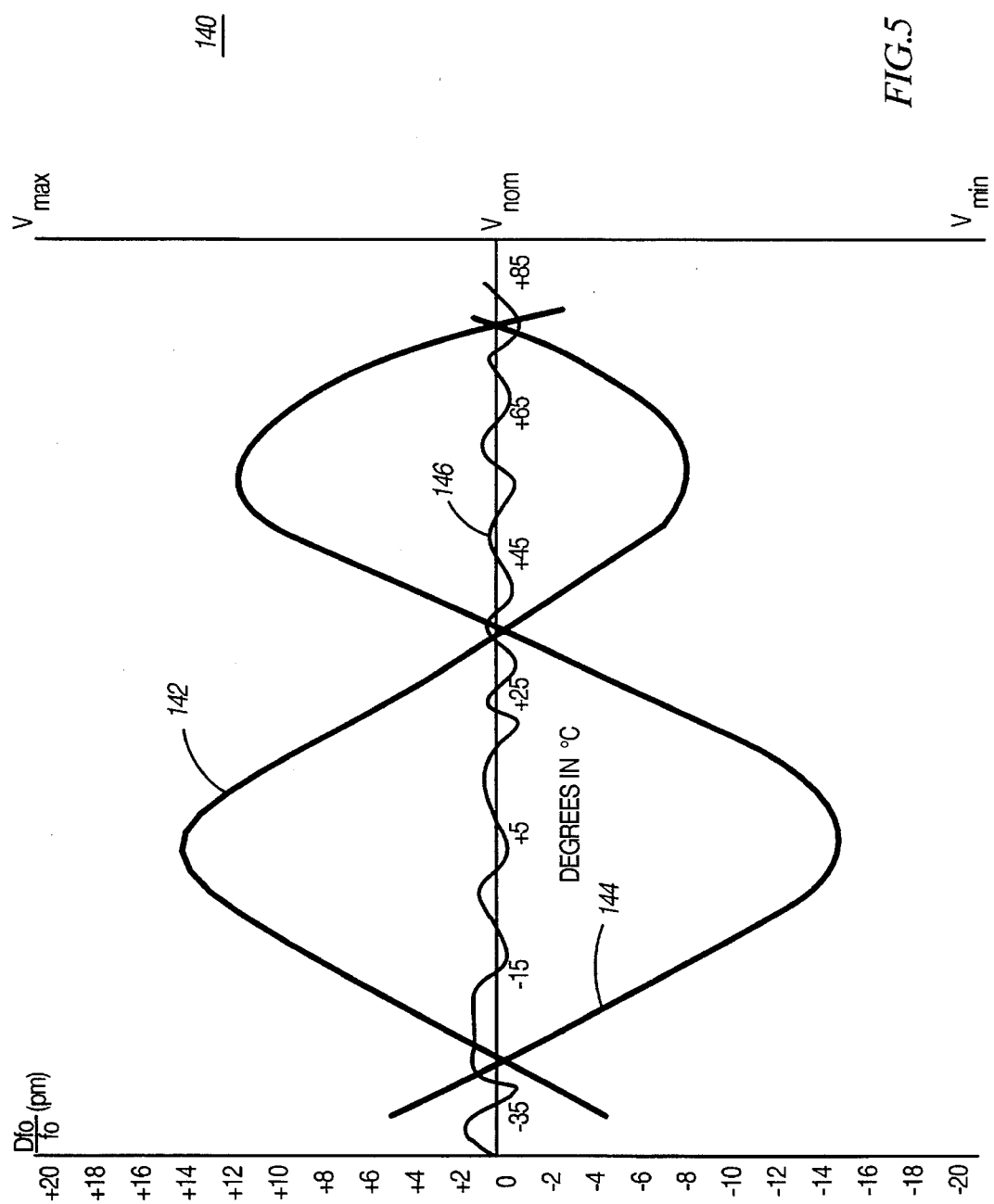
FIG. 5 is a frequency versus temperature graph in connection with temperature compensating crystal oscillators.

The TCN 50 provides a temperature dependent voltage to the VCRE 30 that compensates for the frequency-temperature characteristic of the crystal in the crystal oscillator circuit 12, as shown by line 146 in FIG. 5. This voltage can be adjusted via an appropriate algorithm to match a variety of frequency-temperature characteristics, from a family of AT cut crystals, for example.

More particularly, in a preferred embodiment, the characteristics of a crystal can be determined or measured by, for example, placing the TCXO 10 in an oven, and varying the temperature over a predetermined range (i.e., −35 to +85 degrees C). This can result in a temperature compensation (TC) curve, such as curve 142 in FIG. 5. Next, the algorithm develops an inverse curve 144 based on the TC curve 142. The information in curve 144 is stored (in analog or preferably in digital form in EEPROM), and is used to TC the crystal in the crystal oscillator circuit 12, in order to provide a predetermined frequency output over a wide temperature range, such as that shown as item 146 in FIG. 5.

The TCXQ 10 in FIG. 1 is adapted to being connected to a power supply 66, preferably in the form of a 3-volt battery. The power supply 66 is connected to the low voltage regulator 80 by line 82. An output line 84 of the regulator 80 is connected to the TCN 50. The TCN 50 needs to operate from a supply voltage that is substantially independent of power supply variations caused by, for example, various temperature coefficients of the power supply, aging, and line and load regulation of the power supply 66, so that the signal supplied to the VCRE 30 is substantially stable despite these variations. Thus, the low voltage regulator 80 provides a substantially stable DC voltage to the TCN 50, notwithstanding possible undesirable voltage variations and spikes at line 82.

Figure 2:
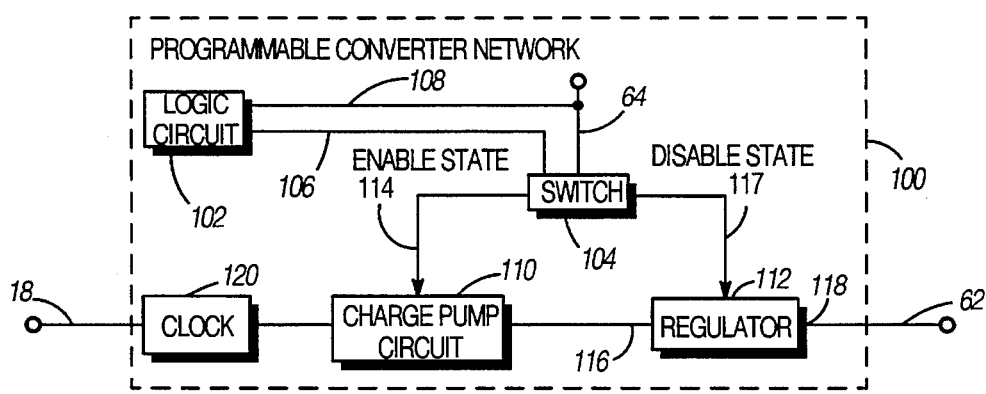
FIG. 2 is a more detailed block diagram of the programmable DC to DC converter network shown in FIG. 1, in accordance with the present invention.

Referring to FIG. 2, the PDCCN 60 (in FIG. 1), is shown in more detail as item 100. The PDCCN 100 generally includes a logic circuit (or memory) 102 and a switch circuit 104, connected by line 106. In one embodiment, the logic circuit 102 is pre-programmed to suitably control switch 104. This can be set in the factory, when the PDCCN 100 is programmed for a predetermined power supply voltage.

The switch circuit 104 can include an enabled or disabled state. In the enabled state, the charge pump circuit 110 is used to operate from power supply 66 and produce a higher output voltage (via charge pump circuit 110) which is then routed to an output regulator 112 via line 116. In the disabled state, the power supply 66 is routed directly to the output regulator 112 from the switch circuit 104, via line 117.

In those instances where the power supply 66 voltage is sufficiently high such that the use of the charge pump circuit 110 is not necessary, the charge pump circuit 110 is disabled to minimize current drain. This is advantageous, because the charge pump circuit 110 draws current. In still more detail, the switch circuit 104 can include a pair of Pochannel MOSFET's configured to either feed power supply 66 to the charge pump circuit 110 in the enabled state or directly to the regulator 112 in the disabled state.

In a preferred embodiment, when using a 3 volt power supply, the switch circuit 104 is pre-set at the factory in EEPROM, to the enabled state after a predetermined initial start up time and in the disabled state at initial start up, for approximately 10 milliseconds or less. For example, the charge pump circuit 110 is disabled when a low voltage battery, such as a 3 volt battery is used, at start up, and thereafter it is enabled during a steady state time (after start up).

When PDCCN 60 and crystal oscillator circuit 12 are integrated onto a common substrate of an IC, it is advantageous to clock the PDCCN 60 with a squared oscillator signal, such as a signal coupled and isolated from line 18, in order to prevent switching transients generated by the PDCCN 60 from coupling through the substrate and mixing with the oscillator output and possibly generating undesirable spurious frequencies at the oscillator output.

In still further detail, a problem can arise when power is first applied (at start up) to the TCXO, since oscillations will not appear at the oscillator output line 18 until after several milliseconds have elased. During these first several milliseconds (start up), it is necessary to supply a positive potential to an output (line 118) of the regulator 112, in order to provide a reverse bias across VCRE 30 to create a sufficiently high reactance, to allow the crystal oscillator circuit 12 to start.

To resolve this problem, switch circuit 104 is used to initially bypass the charge pump circuit 110 when power is initially applied, to connect the power supply 66 directly to the output line 118 of the regulator 112 (line 62 in FIG. 1). After several milliseconds have elapsed (or until steady state has been achieved), and oscillations are available at the oscillator output line 18, switch circuit 104 is then set to its enabled state where charge pump 110 is enabled to operate from power supply 66 and produce a higher output voltage at line 116, which is regulated by item 112 (at line 62) for supplying an appropriate high voltage to level shifter 54 via line 58, in FIGS. 1 and 2.

Referring to FIG. 2, since the charge pump 110 output at line 116 can equal about twice the input supply voltage at line 114, its output variation will also vary about twice as much as the input supply variation. In order to effect an accurate temperature compensation, regulator 112 is used to regulate and provide a stable DC output to the level shifter

54.

Regulator 112 can include any of the conventional regulators, and in one embodiment includes a simple series pass element which is controlled by a differential amplifier and an output reference.

In one embodiment, the logic circuit 102 can include a line 108 connected to input line 64 to dynamically control the switch 104 as appropriate.

Since the power supply 66 voltage can vary widely over time, the logic circuit 102 can be configured to monitor the power supply at line 64 and dynamically switch between the enabled and disabled states based on the detected level or signal at line 64. This can dynamically minimize current drain when higher supply voltages are available, by disabling the charge pump circuit 110 when not needed. The charge pump circuit 110 normally will consume more current at higher voltages, such as about 4 volts, thus it is advantageous to have it disabled when it is not needed.

For example, the charge pump 110 when enabled can be used to selectively increase the DC voltage if below a certain threshold at line 64, in the dynamic control example.

In one embodiment, the charge pump 110 is a voltage doubler and can be implemented in any conceivable conventional manner, so long as it is compatible with the circuitry of TCXO 10. Conventional voltage doublers usually include the following structure. First, a capacitor is connected across a pair of input supply terminals. Next, these connections are broken and the negatively charged terminal of the capacitor is connected to the positive supply terminal while the positively charged terminal of the capacitor is connected to an output with an attached charge holding capacitor. These steps are continuously repeated and will cause the output to ramp up to a voltage equal to about twice the input supply value. The rate at which the capacitor is switched, is controlled by a suitable clock, such as item 120 or input frequency source. The clock 120 can provide a squared waveform, isolation and buffering of line 18.

In a preferred embodiment, line 18 in FIG. 2 is connected to the output of the crystal oscillator circuit 12 in FIG. 1.

In one embodiment, the charge pump 110 could increase the voltage from line 64 which could be at about 2.7 volts, to about 5 volts at line 116, and the regulator 112 slightly lowers it to about 4 volts and helps to minimize unwanted voltage variations at line 118.

The TCXO 10 can be programmed to change dynamically, or is pre-set at the factory when the PDCCN 100 circuit is programmed. Pre-setting the PDCCN 100 is particularly adapted for minimizing current consumption and power drain. This of course can help to lengthen battery life, which is a major advantage in many communication devices.

In FIG. 1, the second terminal 34 of the VCRE 30 is AC grounded, via a capacitor 36 and DC referenced to an output line 62 of the PDCCN 60. This configuration is particularly advantageous when the VCRE 30 is integrated onto a common P– substrate along with other circuits which are capable of coupling noise into the VCRE 30 and can degrade the phase noise performance of the oscillator output. In a preferred embodiment, the cathode of the VCRE 30 is an N– well which is diffused into a common P– substate while the anode of VCRE 30 is formed by implanting P+ type impurities into the N– well. Advantageously, the VCRE 30 can be decoupled and substantially isolated from other circuits within the substrate, by AC grounding the cathode (2nd terminal 34) of VCRE 30, via capacitor 36, in FIG. 1.

The TCN 50 can include a temperature compensation circuit 52 connected to a power supply via a low voltage regulator 80.

To keep power consumption at a minimum, the use of a low voltage regulator is required. Operating the higher current consumption circuits of the temperature compensation network 50, and particularly the temperature compensation circuit 52, and any other high current consumption networks, from a low voltage regulator 80, can reduce the current sourcing requirements of the PDCCN 60, thus reducing the total power consumption requirements.

The low voltage regulator 80 minimizes low voltage variations of the power supply 66 that cannot be compensated out over various temperatures. One primary source of these variations results when power supply 66 is a battery. As a battery is discharged, its output voltage drops. This charging voltage can then modify the output from the temperature compensation circuit and can result in degrading the frequency-temperature characteristics of the TCXO.

The level shifter 54 can include an output connected to the first or second terminal 32 or 34 of the VCRE 30.

As previously stated, the level shifter 54 in FIG. 1, includes an output connected to the first terminal 32 of the VCRE 30 and the crystal oscillator circuit 12 via line 16. The level shifter 54 is used to amplify the low voltage output of temperature compensation circuit 52 and to produce a higher voltage as required by VCRE 30. The temperature compensation circuit 52 operates at a lower, more power efficient voltage and provides a higher voltage (amplified) from the level shifter 54, to temperature compensate the crystal. However, the level shifter 54 uses the highest voltage available at start up and thereafter, at steady state. The level shifter 54 needs a higher supply voltage at line 58 so as to provide sufficient voltage variation to the VCRE 30, to temperature compensate the crystal in crystal oscillator circuit 12.

Figure 3:
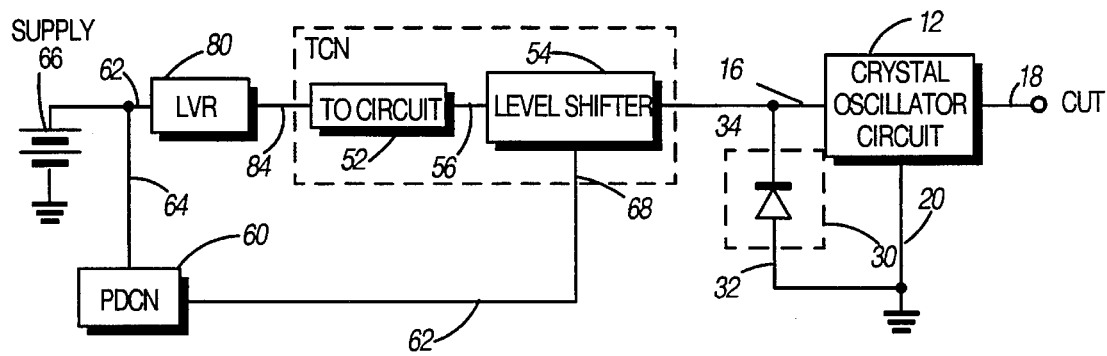
FIG. 3 is an alternate embodiment of a low power temperature compensated crystal oscillator, in accordance with the present invention.

In the embodiment shown in FIG. 3, the output of the level shifter 54 is connected to the second terminal 34 of the VCRE 30. Also in FIG. 3, the first terminal 32 is grounded, and the PDCCN 60 is directly connected to the level shifter 54, via lines 58 and 62.

In the embodiment shown in FIG. 3, it may be more beneficial to reference VCRE 30 to ground, with the circuit shown in FIG. 3, thereby removing the need for capacitor 36. This structure of FIG. 3 is advantageous when either VCRE 30 is a discrete device or when VCRE is integrated onto a common N– substrate and a P– well is diffused into the substrate to form the anode of VCRE 30. The cathode of VCRE 30 is formed by implanting N+ type impurities into the P– well. The VCRE 30 can then be decoupled and substantially isolated from other circuits residing in the substrate, by grounding terminal 32, as shown in FIG. 3.

Figure 4:
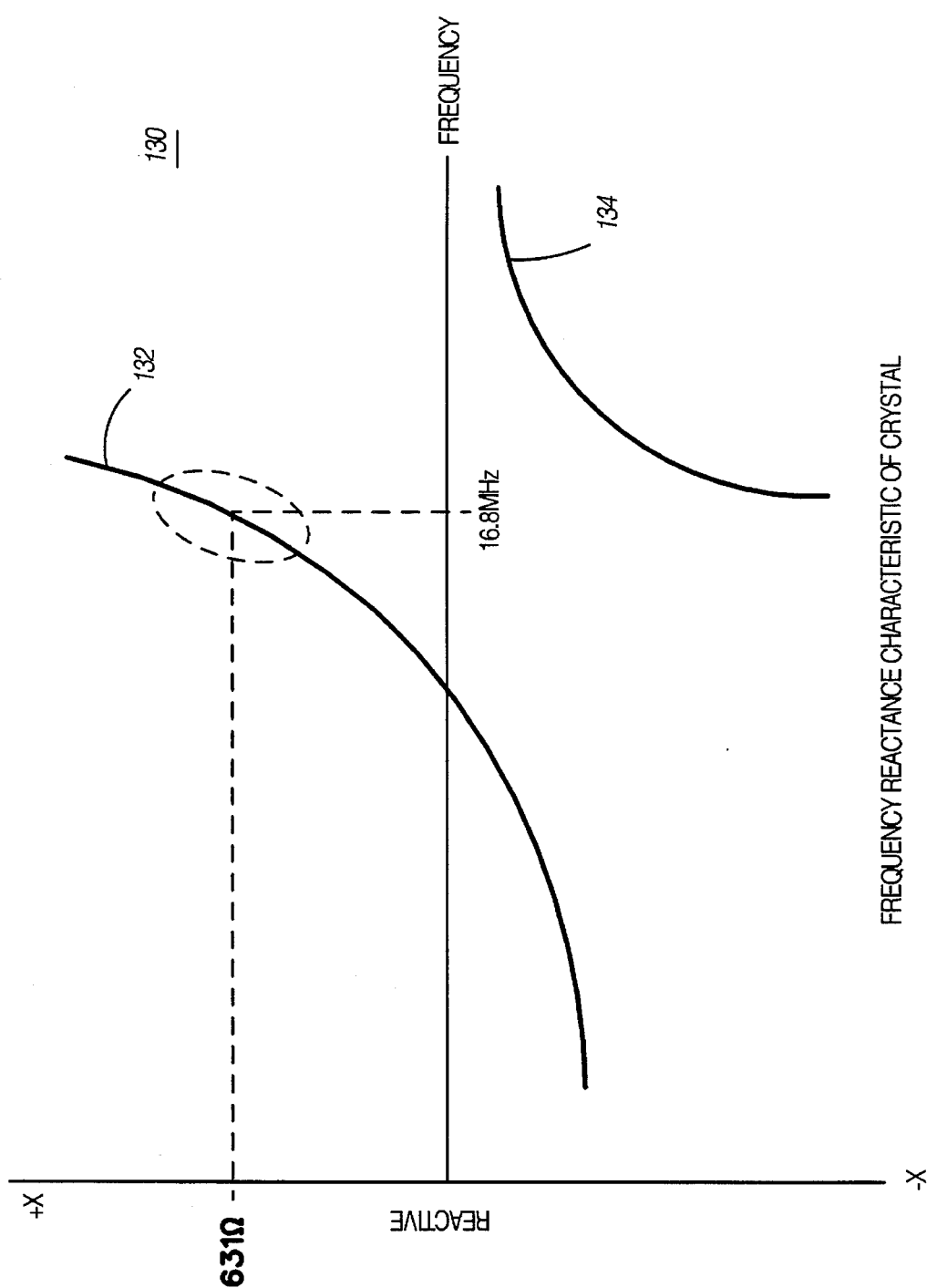
FIG. 4 is a frequency-reactance characteristic of a crystal.

In FIG. 4, a typical frequency versus reactance curve 130 of an AT cut crystal is shown. More particularly, this plot is the crystal reactance as a function of the crystal frequency as required by Barkhausen's oscillation criteria. The crystal operates at a reactance equal and opposite in magnitude to the reactance exhibited by the remainder of the oscillator, including the reactance generated by the VCRE 30. In the majority of crystal oscillators, the crystal is operated as an inductor, with the remainder of the oscillator providing a capacitive reactance. Hence, the crystal is typically operated in the circled area on a first curve 132, between series and anti-resonance. The second curve 134 is shown for completeness. Thus, a typical crystal could be operated in the range of 631 ohms at about 16.8 MHz, as shown in FIG. 4.

In FIG. 5, frequency versus temperature graph 140 is shown. The graph 140 includes a third order noncompensated Bechmann curve 142 typical for AT cut crystals. A second curve 144 includes the inverse of the Bechmann curve 142, and can be useful for adjusting the frequency output of a TCXO. In one embodiment, an AT cut crystal for use in connection with the TCXO 10, includes the Bechmann curve 142 shown in FIG. 5. The horizontal axis in FIG. 5 includes a temperature range from about −35 degrees C. to about 85 degrees C. Item 146 can be a desired temperature compensated frequency over this temperature range. In this embodiment, a 2 ppm specification is shown.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A low power temperature compensated crystal oscillator, comprising:

a crystal oscillator circuit having a crystal, an input and an output at a predetermined frequency;

a voltage controlled reactance element for providing a variable reactance to the input of the crystal oscillator circuit for selectively adjusting the output frequency over a predetermined temperature range, having a first terminal and a second terminal;

a temperature compensation network for measuring the temperature in proximity to the crystal and providing a control signal to the voltage controlled reactance element, to adjust the output frequency within a desired range over a predetermined temperature range; and a programmable DC-DC converter network including an output comprising a reference voltage, connected to at least one of the voltage controlled reactance element and the temperature compensation network.

2. The low power temperature compensated crystal oscillator of claim 1, wherein the programmable DC-DC converter network includes a logic circuit.

3. The low power temperature compensated crystal oscillator of claim 1, wherein the programmable DC-DC converter network includes a charge pump circuit for selectively increasing DC voltage if below a certain threshold.

4. The low power temperature compensated crystal oscillator of claim 1, wherein the programmable DC-DC converter network includes a regulator for minimizing output voltage variations.

5. The low power temperature compensated crystal oscillator of claim 1, wherein the programmable DC-DC converter network includes a logic circuit, a charge pump connected to the logic circuit for selectively increasing DC voltage if below a certain threshold, and a regulator to minimize output voltage variations.

6. The low power temperature compensated crystal oscillator of claim 1, wherein the programmable DC-DC converter network includes a switch circuit having an enabled state where a charge pump is enabled to accept an input supply voltage and produce a higher output voltage which is then routed to an output regulator, and a disabled state where at least one of the supply voltage and a lower derivative voltage of the supply voltage is routed directly to the output regulator.

7. The low power temperature compensated crystal oscillator of claim 6, wherein the switch circuit is initialized to the disabled state when power is first applied, and after a predetermined time following initialization, the switch circuit switched to the enabled state.

8. The low power temperature compensated crystal oscillator of claim 6, wherein the programmable DC-DC converter network includes a programmable logic circuit connected to the switch circuit, for dynamically switching to and from the enabled and disabled state.

9. The low power temperature compensated crystal oscillator of claim 8, wherein the logic circuit is programmed such that the switch circuit feeds the supply voltage to the charge pump during the enabled state and to the regulator during the disabled state.

10. The low power temperature compensated crystal oscillator of claim 1, wherein the programmable DC-DC converter network includes a clock input for providing a timing signal and the clock input is derived from the crystal oscillator circuit output.

11. The low power temperature compensated crystal oscillator of claim 1, wherein the second terminal of the voltage controlled reactance element is AC grounded via a capacitor and DC referenced to an output of the programmable DC-DC converter network.

12. The low power temperature compensated crystal oscillator of claim 1, wherein the temperature compensation network includes:

a temperature compensation circuit connected to a power supply via a low voltage regulator; and a level shifter including an output connected to the first or the second terminal of the voltage controlled reactance element.

13. The low power temperature compensated crystal oscillator of claim 12, wherein the level shifter includes an output line connected to the first terminal of the voltage controlled reactance element and the crystal oscillator circuit.

14. The low power temperature compensated crystal oscillator of claim 1, wherein the first terminal of the voltage controlled reactance element is connected to ground and the second terminal is connected to a level shifter and the crystal oscillator circuit.

15. A low power temperature compensated crystal oscillator, comprising:

a crystal oscillator circuit having a crystal, an input and an output at a predetermined frequency;

a voltage controlled reactance element for providing a variable reactance to the input of the crystal oscillator circuit for selectively adjusting the output frequency over a predetermined temperature range, having a first terminal and a second terminal;

a temperature compensation network for measuring the temperature in proximity to the crystal and providing a control signal to the voltage controlled reactance element, to adjust the output frequency within a desired range over a predetermined temperature range; and a programmable DC-DC converter network including an output comprising a reference voltage, connected to at least one of the voltage controlled reactance element and the temperature compensation network wherein the programmable DC-DC converter network includes a switch circuit having an enabled state, wherein a charge pump is enabled to accept an input supply voltage and produce a higher output voltage which is then routed to an output regulator, and a disabled state where at least one of the supply voltage and a lower derivative voltage of the supply voltage is routed directly to the output regulator.

16. The low power temperature compensated crystal oscillator of claim 15, wherein the temperature compensation network includes:

a temperature compensation circuit connected to a power supply via a low voltage regulator; and a level shifter including an output connected to the first or the second terminal of the voltage controlled reactance element.

17. The low power temperature compensated crystal oscillator of claim 16, wherein the level shifter includes an output line connected to the first terminal of the voltage controlled reactance element and the crystal oscillator circuit.

18. The low power temperature compensated crystal oscillator of claim 15, wherein the first terminal of the voltage controlled reactance element is connected to ground and the second terminal is connected to a level shifter and the crystal oscillator circuit.

* * * * *